US008650450B2

(12) United States Patent
Scarpa et al.

(10) Patent No.: US 8,650,450 B2
(45) Date of Patent: Feb. 11, 2014

(54) METHOD AND APPARATUS FOR INTERLEAVING LOW DENSITY PARITY CHECK (LDPC) CODES OVER MOBILE SATELLITE CHANNELS

(75) Inventors: Carl Scarpa, Plainsboro, NJ (US); Edward Schell, Jackson, NJ (US)

(73) Assignee: Sirius XM Radio Inc., New York, NY (US)

( * ) Notice: Subject to any disclaimer, the term of this patent is extended or adjusted under 35 U.S.C. 154(b) by 944 days.

(21) Appl. No.: 12/221,363

(22) Filed: Aug. 1, 2008

(65) Prior Publication Data

US 2009/0172492 A1 Jul. 2, 2009

Related U.S. Application Data

(60) Provisional application No. 60/963,043, filed on Aug. 1, 2007.

(51) Int. Cl.
*G06F 11/00* (2006.01)

(52) U.S. Cl.
USPC ............................ 714/752; 714/746; 714/751

(58) Field of Classification Search
USPC ......................... 714/752, 751, 746
See application file for complete search history.

(56) References Cited

U.S. PATENT DOCUMENTS

| | | | |
|---|---|---|---|
| 2001/0009569 A1* | 7/2001 | Kang et al. | 375/242 |
| 2001/0050926 A1* | 12/2001 | Kumar | 370/529 |
| 2001/0055320 A1 | 12/2001 | Pierzga et al. | |
| 2002/0003813 A1 | 1/2002 | Marko | |
| 2002/0199149 A1* | 12/2002 | Nagasaki et al. | 714/752 |
| 2003/0193888 A1* | 10/2003 | Sun et al. | 370/208 |
| 2004/0225950 A1* | 11/2004 | Siegel et al. | 714/801 |
| 2005/0128966 A1 | 6/2005 | Yee | |
| 2006/0156170 A1 | 7/2006 | Dinoi et al. | |
| 2007/0011502 A1* | 1/2007 | Lin et al. | 714/702 |
| 2007/0011565 A1* | 1/2007 | Kim et al. | 714/758 |
| 2007/0110191 A1* | 5/2007 | Kim et al. | 375/340 |
| 2007/0201516 A1* | 8/2007 | Lee et al. | 370/538 |

OTHER PUBLICATIONS

International Search Report and Written Opinion of the International Searching Authority, issued for corresponding PCT Application No. PCT/US2008/009297, dated Jan. 21, 2009.

* cited by examiner

*Primary Examiner* — Sarai Butler
(74) *Attorney, Agent, or Firm* — Kramer Levin Naftalis & Frankel LLP

(57) ABSTRACT

Systems, methods and apparatus are described to interleave LDPC coded data for reception over a mobile communications channel, such as, for example, a satellite channel. In exemplary embodiments of the present invention, a method for channel interleaving includes segmenting a large LDPC code block into smaller codewords, randomly shuffling the code segments of each codeword and then convolutionally interleaving the randomly shuffled code words. In exemplary embodiments of the present invention, such random shuffling can guarantee that no two consecutive input code segments will be closer than a defined minimum number of code segments at the output of the shuffler. In exemplary embodiments of the present invention, by keeping data in, for example, manageable sub-sections, accurate SNR estimations, which are needed for the best possible LDPC decoding performance, can be facilitated based on, for example, iterative bit decisions.

25 Claims, 7 Drawing Sheets

Fig. 4 - Channel Interleaver Structure

Fig. 7 – Adaptive noise estimates for 1 time interleaved LDPC code block

METHOD AND APPARATUS FOR INTERLEAVING LOW DENSITY PARITY CHECK (LDPC) CODES OVER MOBILE SATELLITE CHANNELS

CROSS-REFERENCE TO OTHER APPLICATIONS

This application claims the benefit of and hereby incorporates by reference U.S. Provisional Patent Application No. 60/963,043, entitled METHOD AND APPARATUS FOR INTERLEAVING LOW DENSITY PARITY CHECK (LDPC) CODES OVER MOBILE SATELLITE CHANNELS, and filed on Aug. 1, 2007.

TECHNICAL FIELD

The present invention relates to satellite broadcast communications, and more particularly to systems and methods for interleaving LDPC coded data over mobile satellite channels.

BACKGROUND INFORMATION

Mobile receivers of satellite broadcast communications are often faced with signal fades of long duration in particular locations and at particular times. This can be more or less egregious depending upon a given channel's fading characteristics. It is well known that time interleaving a communication signal can be a very effective method to transform a time fading channel into a memory-less channel.

What is thus needed in the art are systems and methods to interleave LDPC coded data for better reception over a mobile satellite channel.

SUMMARY OF THE INVENTION

Systems, methods and apparatus are described to interleave LDPC coded data for reception over a mobile communications channel, such as, for example, a satellite channel. In exemplary embodiments of the present invention, a method for channel interleaving includes segmenting a large LDPC code block into smaller codewords, randomly shuffling the code segments of each codeword and then convolutionally interleaving the randomly shuffled code words. In exemplary embodiments of the present invention, such random shuffling can guarantee that no two consecutive input code segments will be closer than a defined minimum number of code segments at the output of the shuffler. In exemplary embodiments of the present invention, by keeping data in, for example, manageable sub-sections, accurate SNR estimations, which are needed for the best possible LDPC decoding performance, can be facilitated based on, for example, iterative bit decisions.

It is noted that the patent or application file contains at least one drawing executed in color. Copies of this patent or patent application publication with color drawings will be provided by the U.S. Patent Office upon request and payment of the necessary fees.

DETAILED DESCRIPTION

It is well known that time interleaving a communication signal can be a very effective method for transforming a time fading channel into a memory-less channel. The amount of interleaving that needs to be performed is typically a function of the channel's fading characteristics and system delay tolerance. In a broadcast channel, delay is generally not of major concern. In exemplary embodiments of the present invention this allows for the dedication of large amounts of hardware memory to interleave over as much time as possible.

Figure 1:
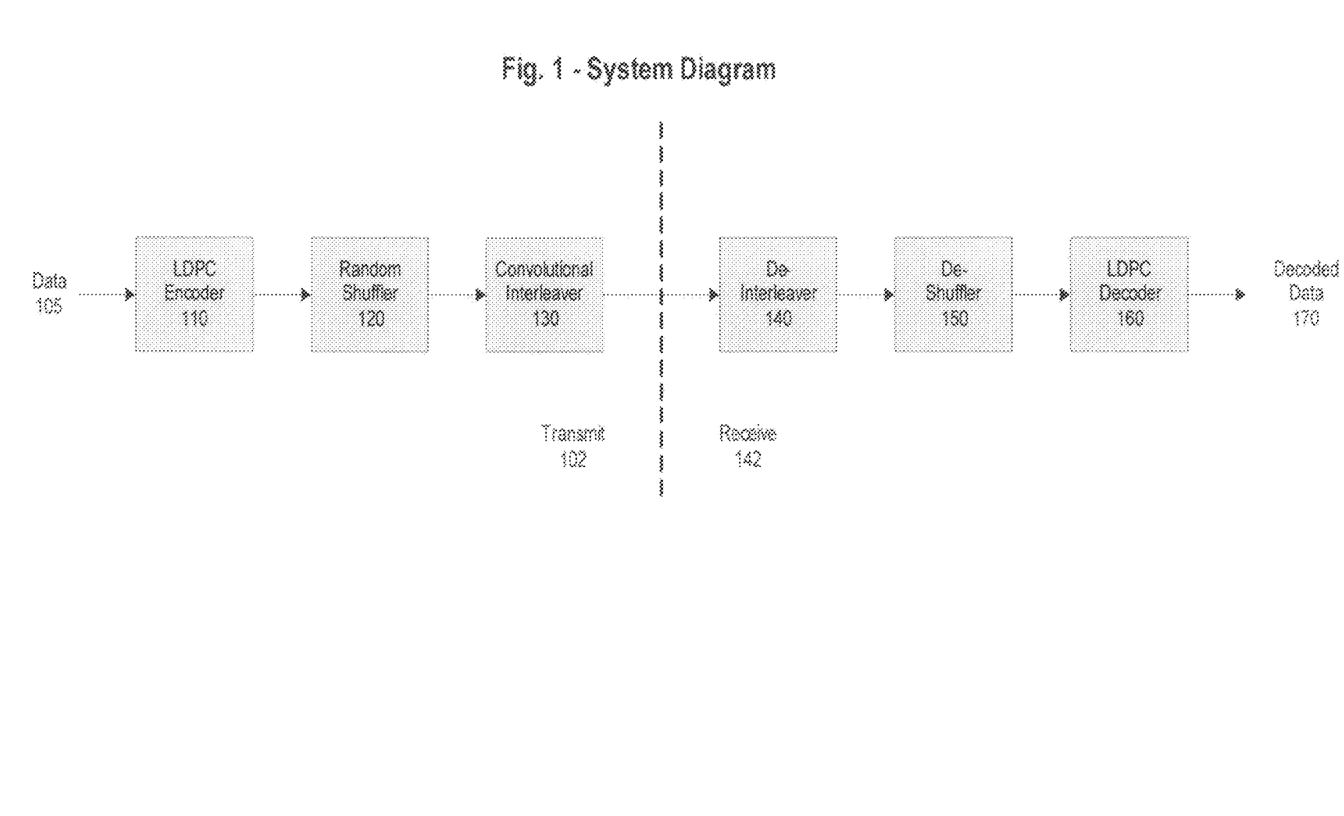
FIG. 1 depicts an exemplary system according to an exemplary embodiment of the present invention.

FIG. 1 depicts an exemplary system for implementing a method of interleaving large LDPC code blocks over mobile channels according to an exemplary embodiment of the present invention. The method disclosed is independent of the specific details of a given LDPC encoder, and can be applied to any LDPC code block size and code rate. With reference to FIG. 1, on the transmit side 102 at the left of the figure, data 105 is input to LDPC encoder 110. From there it is sent to Random Shuffler 120, and from there to Convolutional Interleaver 130. From the output of Convolutional Interleaver 130 the data is transmitted over a communications channel to a receiver. At the receive side 142, essentially the inverse set of operations are performed. Thus, the received data is input to De-interleaver 140, then to De-shuffler 150, and from there to LDPC decoder 160, which outputs the decoded data 170.

In exemplary embodiments of the present invention a LDPC code can originate as a large block code (e.g., thousands of bits) using low coding rates. Again with reference to FIG. 1, in exemplary embodiments of the present invention an LDPC encoder 110 can be fed into a shuffler 120 that breaks the large code block into smaller subsections and randomly permutes these subsections within each code block. The random subsections can then, for example, be applied to a convolutional interleaver 130, with an entire subsection applied to each interleaving arm. A convolutional interleaver 130 is the preferred module or component for this task due its ability to achieve large spreading times with minimal memory usage.

Figure 2:
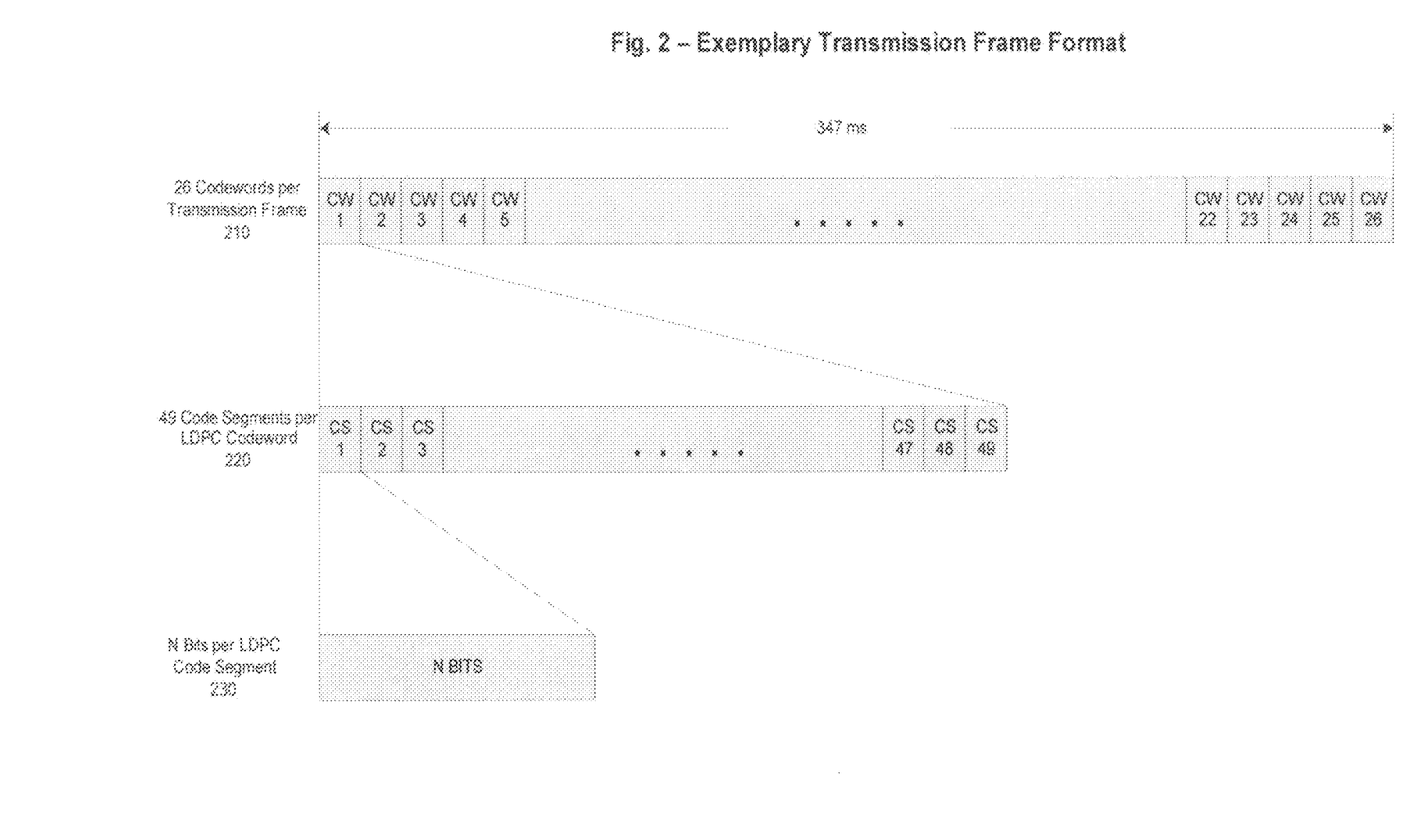
FIG. 2 depicts an exemplary transmission frame format according to an exemplary embodiment of the present invention.

FIG. 2 depicts an exemplary Transmission Frame Format according to an exemplary embodiment of the present invention. For purposes of illustration it will be assumed that there is a transmission frame 210 with 26 codewords (said codewords labeled as "CW" in FIG. 2). It is further assumed that each LDPC codeword 220 is composed of 49 code segments (each said code segment labeled "CS" in FIG. 2), where each code segment 230 has N bits. For an example where N=100 bits, there are thus 49 code segments (CSs) of 100 bits each making 4,900 bits per segment (CS), and 26 total code words (CWs) forming one transmission frame 210, thus comprising 26 CW*49 CS/CW*10 bits/CS=127,400 bits. It is understood that the systems and methods disclosed herein can equally apply to any LDPC code block size, any number of code blocks per transmission frame and any selected sub section size. In exemplary embodiments of the present invention, to achieve good time diversity the number of subsections can be on the order of 2% of the code block size, or less.

Figure 3:
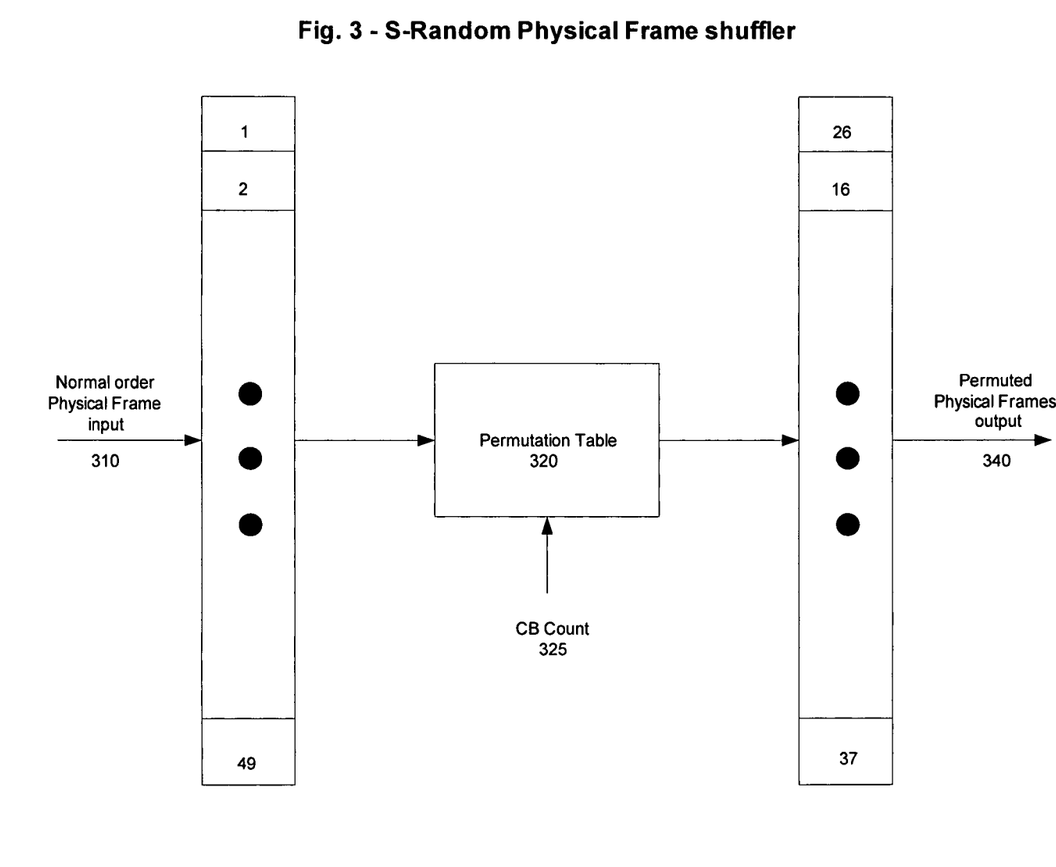
FIG. 3 depicts an exemplary S-Random Physical Frame shuffler according to an exemplary embodiment of the present invention.

As shown in FIG. 1, after encoding, a first task, for example, is to randomize each subsection of a large LDPC code. This process is illustrated, for example, in FIG. 3, by use of, for example, a S-random block interleaver (shuffler). FIG. 3 depicts one of the code words (CWs) 220 of FIG. 2, which has 49 code segments (CSs), as shown therein. In FIG. 3 an exemplary code word is indexed as 310. FIG. 3 illustrates how these 49 code segments can be randomly shuffled, according to an exemplary embodiment of the present invention. The S-random shuffler can ensure that any two consecutive code segments (CSs) of a code word (CW) will be randomly permuted to have a defined minimum output time separation. For a code word CW divided into, for example, 49 code segments CS, an S-random shuffler can be designed to guarantee, for example, that no two consecutive input subsections will be closer than 4 subsections at the output of the shuffler. Such a process can be performed, for example, by first loading the entire code word 310 (i.e., all 49 subsections) into a buffer and then reading out each of the 49 code segments of code word 310 in a random order. In general an S-random shuffler can guarantee that given a code word with a total of X subsections or code segments (here 49) to be shuffled, no two consecutive input code segments will be closer than Y subsections, where X is the next integer greater than [sqrt(Y)]/2, here [sqrt(49)]/2=7/2=3.5, and thus X=4.

The readout order from the S-random shuffler can, for example, be controlled by a lookup table 320 (labeled "Permutation Table" in FIG. 3) and can, for example, be different for each code block (codeword) within a transmission frame (the terms "codeword" and "code block" are synonymous as used in this description, and will both be used herein). Moreover, in exemplary embodiments of the present invention, the table can repeat itself after every transmission frame 310. Thus, in the example depicted in FIG. 3, there are 26 permutation tables 320 that can be used, one for each code block (codeword CW) in a transmission frame. Codeblock CB Count 325 thus stores the number of which code block (of the available 26 in this example) is being operated upon, and inputs that value to Permutation Table 320.

Such S-random shuffling operation can, for example, ensure that random portions of each LDPC code are applied to the convolutional interleaver. This can, for example, minimize the possibility of consecutive data or parity bits being erased due to long fading. It is understood, of course, that this functionality depends upon the length of the fade condition. Thus, if a fade is longer than the convolutional interleaver's time duration, then consecutive data and/or parity bits can be erased by the channel. The output 340 of the S-random shuffler is thus the code block 310 with its various code segments CS now in a very different, randomly permuted order. (It is noted that in FIG. 3 the code segments are labeled as "Physical Frames", which refers to the same thing as CS in FIG. 2).

Figure 4:
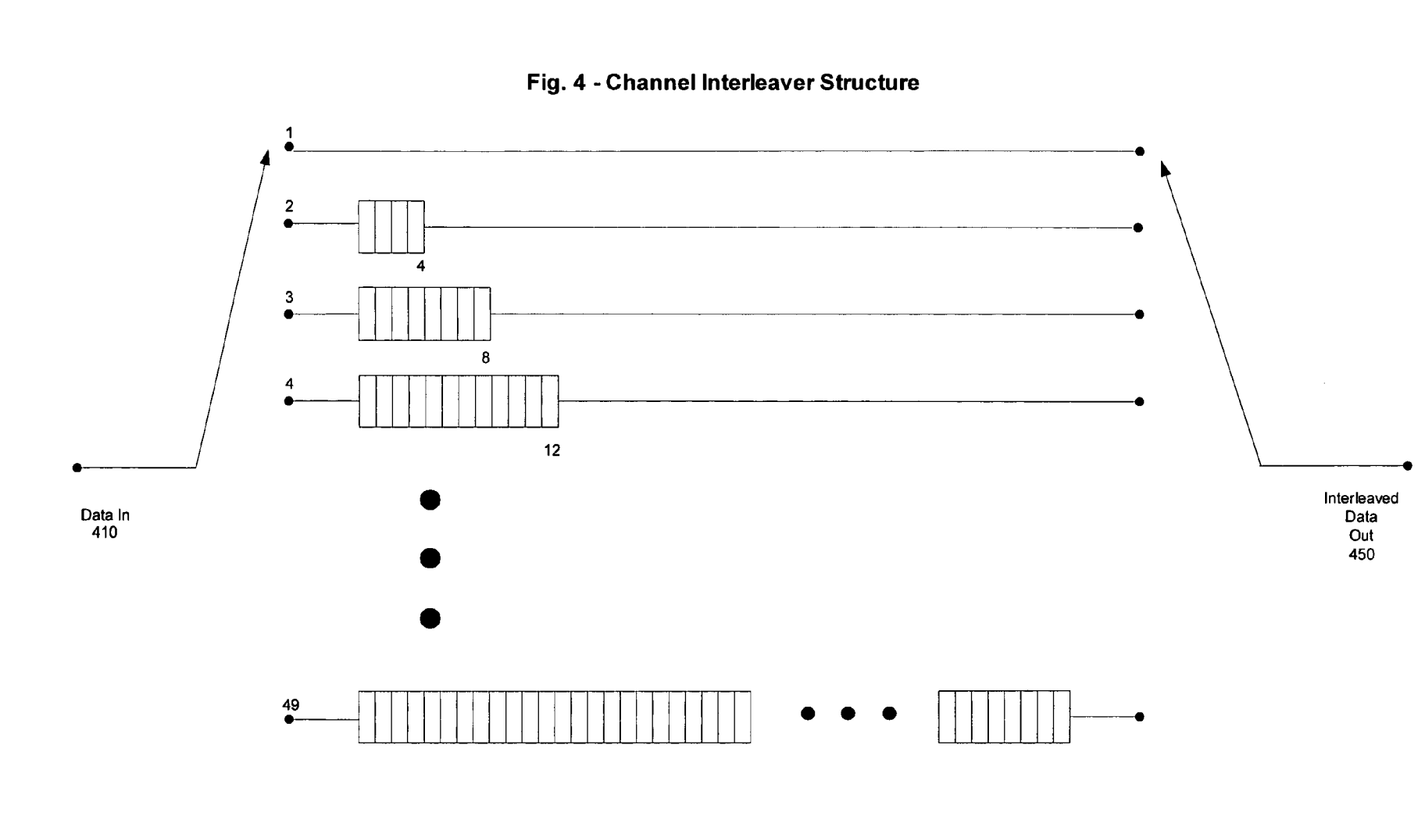
FIG. 4 illustrates an exemplary channel interleaver structure according to an exemplary embodiment of the present invention.

FIG. 4 depicts an exemplary interleaver according to an exemplary embodiment of the present invention. The depicted structure is a well known convolutional interleaver (CI). The CI's arms move in sync with each other, so as to, for example, each process one whole S-random permuted segment of data, having, as noted, N bits. In the example described above, N=100. The interleaver can have, one branch for each segment of data in a codeword (here for example, 49 branches), that can be, for example, synchronized to the transmission frame boundary. Hence, the CI arms can perform, for example, exactly 26 revolutions per transmission frame, each lasting one codeword's time duration per revolution.

In exemplary embodiments of the present invention each branch of a CI can, for example, be passed an entire code segment of data (100 bits), with each arm of the CI being of varying length. The effect of such a CI operation is to time disperse each of the code segments of data (as noted, in the depicted example of FIGS. 3-4, there are 49 such code segments, each having 100 bits). Naturally, the time dispersion achieved is a function of CI size, and is a system defined value, with a preferred minimum time dispersion on the order of, for example, 2.5 seconds or more.

Figure 5:
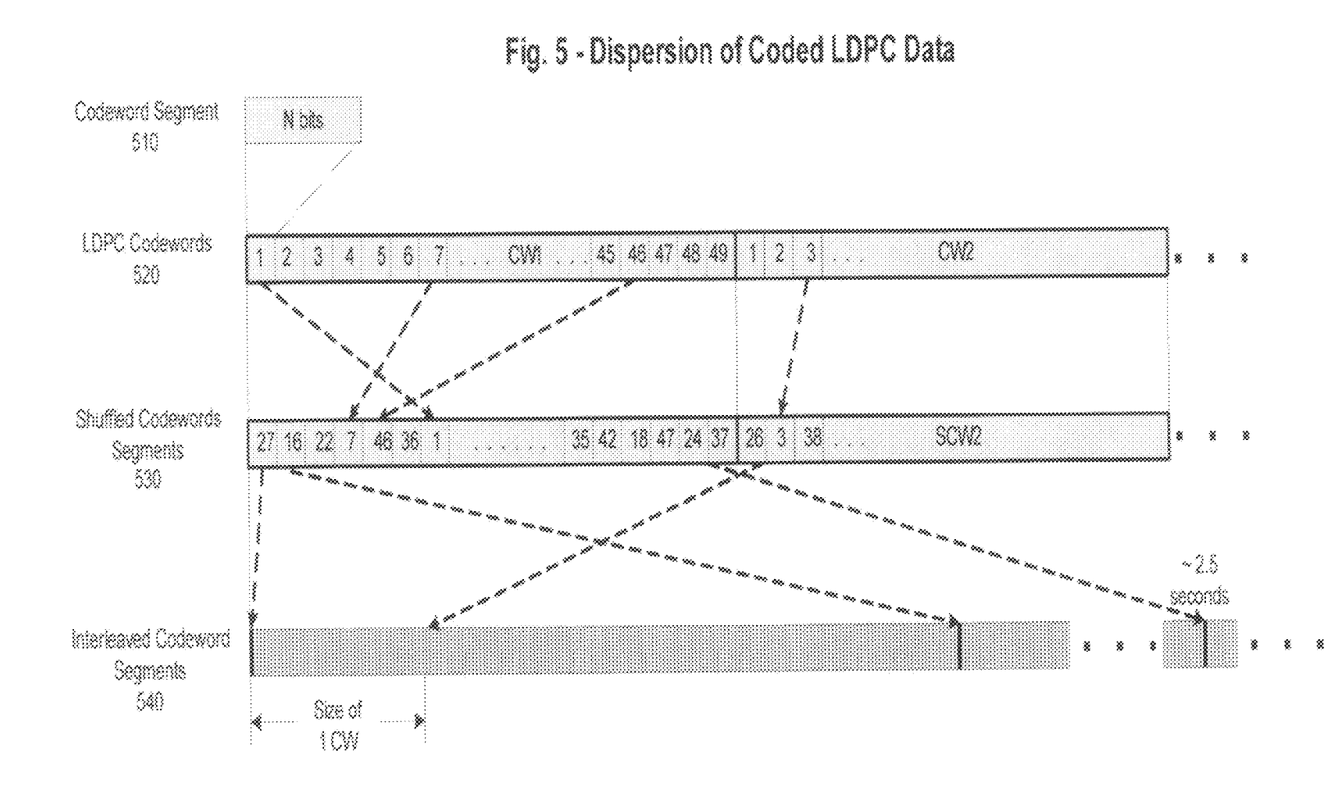
FIG. 5 illustrates an exemplary dispersion of coded LDPC data according to an exemplary embodiment of the present invention.

FIG. 5 depicts how a single codeword can be randomly dispersed over, for example, a time duration of 2.5 seconds, after shuffling. Thus, consistent with the descriptive example used above, FIG. 5 depicts 49 codeword segments 510 of N bits each in various LDPC Codewords 520. The Codewords 520 are randomly shuffled, as described above, thus becoming Shuffled Codeword Segments 530. Then, after interleaving, the various Interleaved Codeword Segments codewords are spread out in time well beyond one transmission frame's temporal duration (FIG. 2 indictaes a Transmission Frame 220 duration of 347 msec, and FIG. 5 indictaes that CW1 has been spread over 2.5 seconds, with code segments from CW2 interspersed between the various code segments of CW1.

Figure 6:
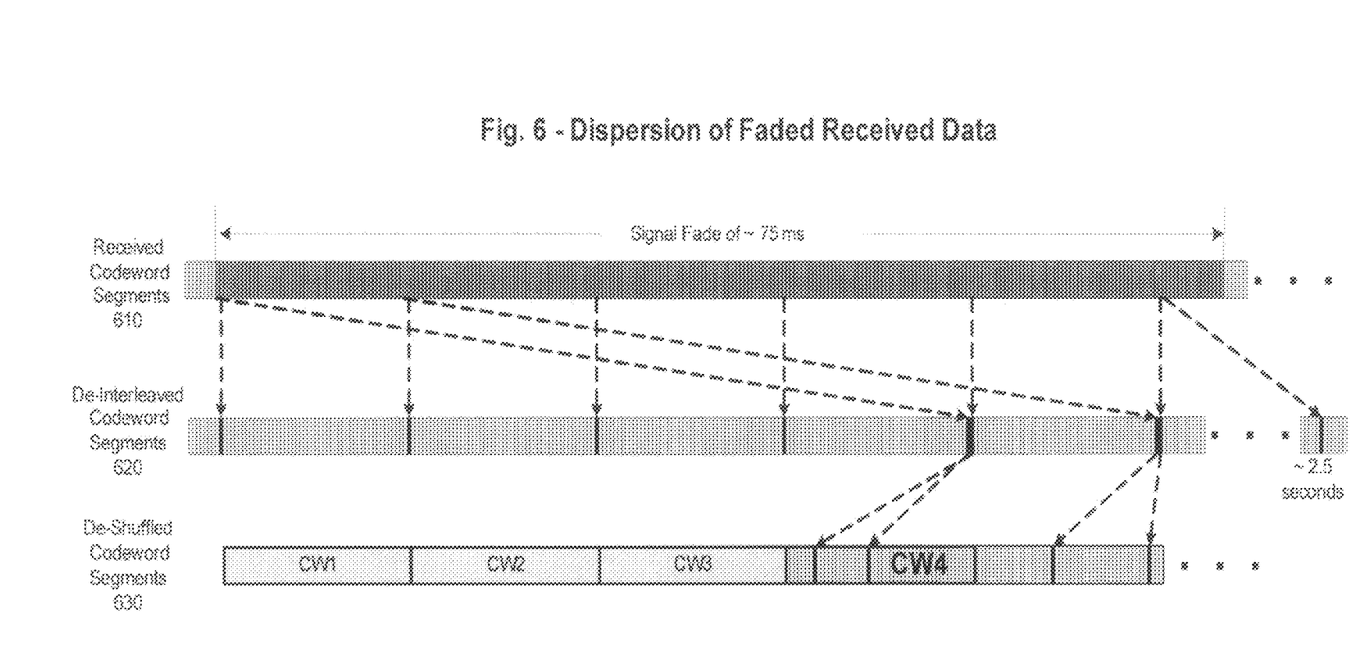
FIG. 6 illustrates an exemplary dispersion of faded received data according to an exemplary embodiment of the present invention.

Similarly, FIG. 6 is a depiction of an isolated signal fade of fairly long duration (typically, for example, greater than 75 milliseconds). The received data experiences the fade by contiguous data subsections being attenuated into the noise floor (erased). After de-interleaving according to exemplary embodiments of the present invention, the same faded subsections can be dispersed over a much longer time duration. FIG. 6 shows how an exemplary de-interleaver has dispersed a single isolated fade so that each LDPC code block never contains more than two (2) subsections affected by the fade, as is seen for CW4 and CW5, for example.

In exemplary embodiments of the present invention, a LDPC decoder requires knowledge of the received noise variance in order to properly form log likelihood ratios. Log likelihood ratios are, as known, a measure of how likely a soft decision for a given received symbol is. It can be understood as an indication as to how far away a given received symbol is from the x-y axis in an I,Q plot. In general, a slicer can make a hard decision or can give a log likelihood ratio as to the quadrant a particular received symbol is in.

As a received signal is de-interleaved, each segment of that signal will generally have a different noise variance. Thus, in exemplary embodiments of the present invention, a noise variance for each segment can, for example, first be estimated based on traditional noise variance cluster estimates. If the LDPC code contains N segments, then N independent noise variances can, for example, be estimated (one representing the average for each subsection of data samples). It is this metric that allows an LDPC decoder to essentially soft weight the merit of each segment for an iterative decoding process. To simplify the noise estimate, each segment can, for example, be aligned with a physical frame transmission, with one noise variance estimate for each physical frame. The initial noise estimate can, for example, be based on raw sliced decisions, averaging the squared distance of the received signal to the targeted hard decision symbol.

Unfortunately, under low SNR conditions, initial decisions can have large numbers of errors, leading to inaccurate noise estimates. This can be especially true in COFDM reception where the subsection of a signal that is decoded is based on an entire physical frame. This approach does not take into account the fact that some symbols within a COFDM physical frame are in deep nulls or the fact that the COFDM sliced errors are weighted by the channel state information. To improve on the noise variance estimate (which improves the LDPC decoding ability via correct soft weighting of the LDPC codes subsections), in exemplary embodiments of the present invention, the noise variance of each segment can be, for example, re-calculated on every iteration of the LDPC decoder. The idea behind re-calculating at each iteration is that the LDPC decoder comes closer and closer to estimating the correct bit decisions, hence providing a new target hard bit decision for the noise power estimate. After each iteration, the noise estimate improves and the weighting for each segment can correspondingly be subsequently improved. This function allows for improvement in the decoder, particularly under COFDM reception where the initial noise estimates can be highly incorrect, as noted.

Figure 7:
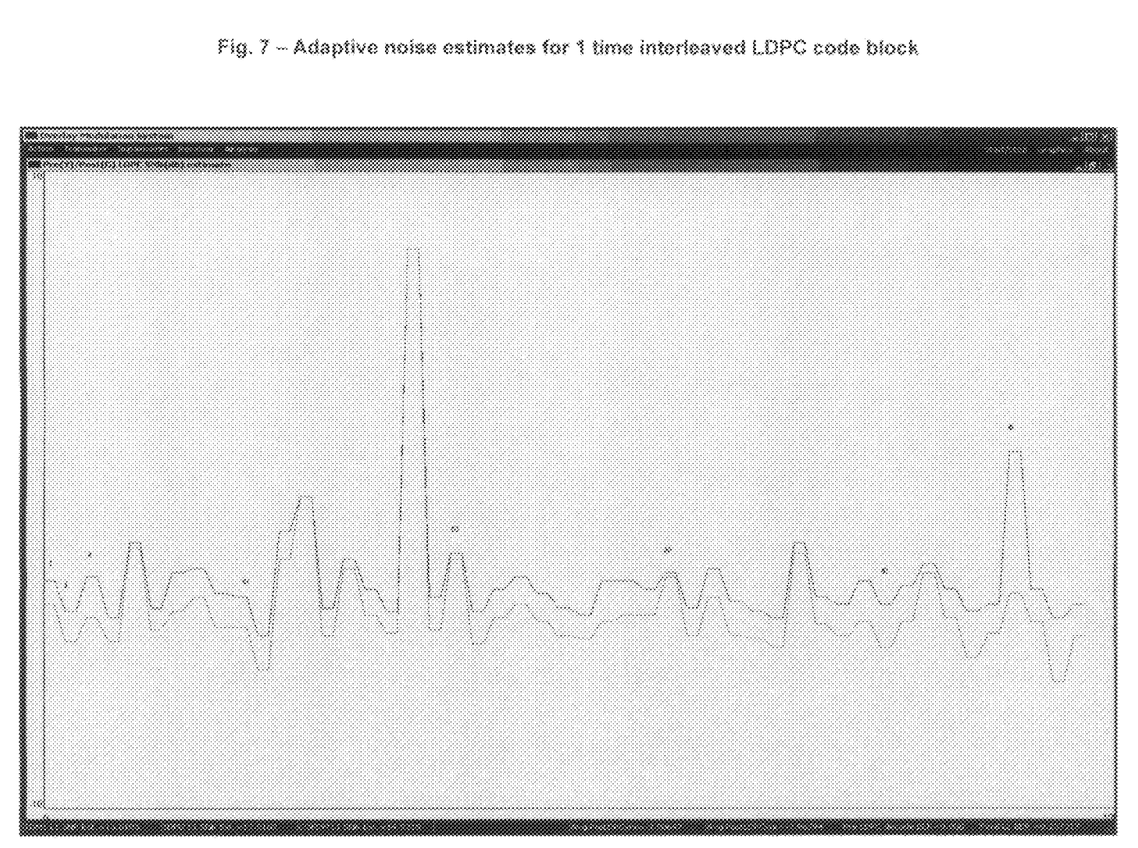
FIG. 7 depicts plots of exemplary initial and final adaptive noise estimates according to an exemplary embodiment of the present invention.

In exemplary embodiments of the present invention, if data is interleaved in a manageable fashion, then adaptive estimation of the noise variance can be implemented. Thus, for example, the performance of an exemplary adaptive noise estimator for an exemplary COFDM received signal is shown in FIG. 7. The top curve shown in FIG. 7 (the blue trace in the color version) is an initial exemplary noise variance estimate into an LDPC decoder, and the bottom curve of FIG. 7 (the red trace in the color version) is the final estimate of the noise variance after sixty (60) LDPC iterations. In general, under noisy conditions, the initial noise variance estimate can be off by 2-3 dB. This inaccuracy can be caused by incorrect sliced bit decisions, which can mask the true noise variance. It is thus noted that the noise variance estimate for code segment number 46 (seen at the far right of FIG. 7) is initially optimistically off by more than 7 dB. The plot of FIG. 7 shows the benefit of adaptively estimating the noise variance, which can only be performed if the data is interleaved in a manageable fashion.

The inventive method of interleaving described above has been seen to be every effective in combating severe satellite fading channels. Additionally, such method provides a manageable procedure to accurately obtain noise variance estimates under fading conditions, from either a satellite channel, for example, or from a terrestrial channel.

While the present invention has been described with reference to certain exemplary embodiments, it will be understood by those skilled in the art that various changes may be made and equivalents may be substituted without departing from the scope of the invention. In addition, many modifications may be made to adapt a particular situation or material to the teachings of the invention without departing from its scope.

Therefore, it is understood that the invention not be limited to any particular embodiment, but that the invention will include all embodiments falling within the scope of the appended claims.

What is claimed:

1. A method of interleaving Low Density Parity Check (LDPC) codes over mobile satellite channels, comprising:
   segmenting a large LDPC code block into smaller codewords, each codeword having multiple code segments, the size of a code segment being less than 3% of the codeword;
   randomly shuffling the code segments within each codeword;
   convolutionally interleaving the shuffled code segments such that code segments from various codewords are mutually interleaved; and
   transmitting the interleaved codewords over a satellite channel to a mobile receiver.

2. The method of claim 1, wherein said convolutionally interleaving achieves at least a defined minimum time dispersion.

3. The method of claim 1, wherein said convolutional interleaving includes applying an entire codeword to each arm of a convolutional interleaver.

4. The method of claim 1, wherein the readout order of code segments from the random shuffler is controlled by a lookup table.

5. The method of claim 4, wherein said readout order of code segments is different for each codeword.

6. The method of claim 1, wherein:
   a transmission frame comprises N codewords, and
   said convolutional interleaving spreads out in time at least some of the original code segments in each codeword a time $T_{spread}$ greater than the transmission time $T_{frame}$ of the transmission frame.

7. The method of claim 6, wherein $T_{spread}$ is $K* T_{frame}$, where K is a number between 1 and 10.

8. A system, comprising:
   a transmitter comprising:
      an LDPC encoder;
      a random shuffler; and
      a convolutional interleaver; and
   a receiver comprising:
      a de-interleaver;
      a de-shuffler; and
      an LDPC decoder,
      wherein in operation:
      (i) the LDPC encoder segments a large LDPC code block into smaller codewords, each codeword having multiple code segments, the size of a code segment being less than 3% of the codeword,
      (ii) the random shuffler shuffles code segments within the codewords, and
      (iii) the convolutional interleaver interleaves the various code segments from various codewords.

9. The system of claim 8, wherein the convolutional interleaver has one branch for each codeword of data.

10. The system of claim 8, wherein the random shuffler is an S-random shuffler.

11. The system of claim 10, wherein said S-random shuffler is designed to guarantee that no two consecutive input segments of a codeword will be closer than Y segments at the output of the shuffler, where Y is equal to or the next integer greater than [Sqrt (X)]/2, where X=total number of code segments within the codeword.

12. The system of claim 8, wherein the readout order of said random shuffler is at least one of controlled by a lookup table and different for each code block within a transmission frame.

13. The system of claim 12, wherein said lookup table can repeat itself after every transmission frame.

14. The receiver of claim 8, wherein in operation the LDPC decoder first estimates a noise variance for each code segment based on traditional noise variance cluster estimates.

15. The receiver of claim 14, wherein the noise variance for each code segment is re-calculated on every iteration of the LDPC decoder.

16. The system of claim 8, wherein:
   a transmission frame comprises N codewords, and
   said convolutional interleaver spreads out in time at least some of the original code segments in each codeword a time $T_{spread}$ greater than the transmission time $T_{frame}$ of the transmission frame.

17. The system of claim 16, wherein $T_{spread}$ is $K* T_{frame}$, where K is a number between 1 and 10.

18. A transmitter, comprising:
an LDPC encoder;
a random shuffler, said shuffler randomly shuffling code segments within codewords, said codewords being smaller components of LDPC code blocks, the size of a code segment being less than 3% of the codeword; and
a convolutional interleaver arranged to mutually interleave code segments from the various shuffled codewords to create an output signal.

19. The transmitter of claim 18, wherein the convolutional interleaver has one branch for each segment of data.

20. The transmitter of claim 18, wherein the random shuffler is an S-random shuffler.

21. The transmitter of claim 18 wherein said random shuffler is designed to guarantee that no two consecutive input code segments will be closer than Y segments at the output of the shuffler, where Y is equal to or the next integer greater than $[\text{Sqrt}(X)]/2$, where X=total number of segments.

22. A program storage device readable by a processing unit, tangibly embodying a program of instructions executable by the processing unit to implement a method of interleaving Low Density Parity Check (LDPC) codes over mobile satellite channels, said method comprising:
segmenting a large LDPC code block into smaller codewords, each codeword having multiple segments the size of a code segment being less than 3% of the codeword;
randomly shuffling the code segments within each codeword;
convolutionally interleaving the now internally shuffled codewords to mutually interleave code segments from the various shuffled codewords to create an output signal; and
transmitting the output signal over a satellite channel to a mobile receiver.

23. The program storage device of claim 22, wherein said convolutionally interleaving achieves at least a defined minimum time dispersion.

24. The program storage device of claim 18, wherein said convolutional interleaving includes applying an entire codeword to each arm of a convolutional interleaver.

25. The program storage device of claim 22, wherein said random shuffling is designed to guarantee that no two consecutive input segments of a codeword will be closer than Y segments at the output of the shuffler, where Y is equal to or the next integer greater than $[\text{Sqrt}(X)]/2$, where X=total number of segments.

* * * * *